(12) United States Patent
Thayer et al.

(10) Patent No.: US 7,444,366 B2
(45) Date of Patent: *Oct. 28, 2008

(54) FASTER SHIFT VALUE CALCULATION USING MODIFIED CARRY-LOOKAHEAD ADDER

(75) Inventors: Paul R. Thayer, Fort Collins, CO (US); Sanjay Kumar, Livermore, CA (US)

(73) Assignees: Hewlett-Packard Development Company, L.P., Houston, TX (US); Intel Corporation, Santa Clara, CA (US)

( * ) Notice: Subject to any disclaimer, the term of this patent is extended or adjusted under 35 U.S.C. 154(b) by 746 days.

This patent is subject to a terminal disclaimer.

(21) Appl. No.: 10/853,518

(22) Filed: May 26, 2004

(65) Prior Publication Data

US 2004/0220991 A1    Nov. 4, 2004

Related U.S. Application Data

(63) Continuation-in-part of application No. 09/507,376, filed on Feb. 18, 2000, now abandoned.

(51) Int. Cl.
*G06F 7/38* (2006.01)
*G06F 7/50* (2006.01)

(52) U.S. Cl. .................. 708/501; 708/708

(58) Field of Classification Search .......... 708/501, 708/708, 709
See application file for complete search history.

(56) References Cited

U.S. PATENT DOCUMENTS

| | | | |
|---|---|---|---|
| 4,228,520 A | 10/1980 | Letteney et al. | |
| 4,425,623 A | 1/1984 | Russell | |
| 4,573,137 A | 2/1986 | Ohhashi | |
| 4,737,926 A | 4/1988 | Vo et al. | |
| 4,789,958 A | 12/1988 | Maejima et al. | |
| 4,811,272 A | 3/1989 | Wolrich et al. | |
| 4,839,846 A | 6/1989 | Hirose et al. | |
| 4,841,467 A | 6/1989 | Ho et al. | |
| 5,043,934 A | 8/1991 | Lamb | |
| 5,166,899 A | 11/1992 | Lamb | |
| 5,195,051 A | 3/1993 | Palaniswami | |
| 5,253,195 A | 10/1993 | Broker et al. | |
| 5,351,207 A | 9/1994 | Girard et al. | |
| 5,479,356 A | 12/1995 | Shackelford et al. | |
| 5,508,952 A | 4/1996 | Kantabutra | |
| 5,636,157 A * | 6/1997 | Hesson et al. | 708/714 |
| 5,719,803 A * | 2/1998 | Naffziger | 708/710 |

(Continued)

OTHER PUBLICATIONS

IEEE Standard for Binary Floating-Point Arithmetic, Standards Committee of the IEEE Computer Society, IEEE Std. 754-1985.

(Continued)

*Primary Examiner*—Chuong D Ngo

(57) ABSTRACT

Circuitry for reducing propagation delays in calculation of a value for use in a floating point multiply-accumulate operation. In the circuitry, a carry-save adder receives values of three input operands from three latches. A carry-lookahead adder receives the outputs from the carry-save adder and implements an XOR operation on a most-significant bit along with its own logic operation to produce the value for the floating point multiply-accumulate operation. Modification of the carry-lookahead adder to perform the XOR operation results in elimination of an entire stage of logic.

5 Claims, 11 Drawing Sheets

U.S. PATENT DOCUMENTS

| | | |
|---|---|---|
| 5,757,686 A | 5/1998 | Naffziger et al. |
| 5,790,444 A * | 8/1998 | Olson et al. .................. 708/501 |
| 5,859,999 A | 1/1999 | Morris et al. |
| 5,860,017 A | 1/1999 | Sharangpani et al. |
| 5,877,973 A | 3/1999 | Kato et al. |
| 5,892,698 A | 4/1999 | Naffziger |
| 5,944,777 A | 8/1999 | Kumar et al. |

OTHER PUBLICATIONS

Wolfe, A., "Patents shed light on Merced's Innards", Electronic Engineering Times, Feb. 15, 1999.

* cited by examiner

US 7,444,366 B2

FASTER SHIFT VALUE CALCULATION USING MODIFIED CARRY-LOOKAHEAD ADDER

CROSS-REFERENCE TO RELATED PATENT APPLICATIONS

This application is a continuation-in-part application of U.S. patent application Ser. No. 09/507,376 filed Feb. 18, 2000, now abandoned, entitled "FASTER SHIFT VALUE CALCULATION USING MODIFIED CARRY-LOOKAHEAD ADDER," (the parent application), the subject matter of which is incorporated herein by reference. This application claims the benefit of the parent application.

The following other continuation-in-part application, also based on the above-referenced parent patent application, is incorporated herein by reference: U.S. patent application Ser. No. 10/613,095 filed Jul. 7, 2003, now U.S. Pat. No. 7,240,085, entitled "FASTER SHIFT VALUE CALCULATION USING MODIFIED CARRY-LOOKAHEAD ADDER."

TECHNICAL FIELD

The technical field relates to an apparatus and method for use in implementing a floating point multiply-accumulate operation.

BACKGROUND

Logic circuitry has been developed to implement a floating point multiply-accumulate operation (FMAC). This operation performs on three operands (A, B, C) the operation A*B+C. The FMAC operation is useful in that it can be used to implement both addition and multiplication in logic circuitry. In particular, for an add operation, the operand A is set to a value one. For a multiply operation, the operand C is set to a value zero.

For example, FIG. 1 is a diagram of a prior art circuit 10 for use in implementing an FMAC operation. In circuit 10, three latches 12, 14, and 16 contain three 17-bit operands A, B, and C. The values of those operands are input to a first carry-save adder (CSA) 18. The result of the first CSA 18 is input to a second CSA 20 along with the value of a constant received on line 22. Finally, the output of the second CSA adder 20 is input to a carry-lookahead adder (CLA) 24, which performs an add operation and outputs a resulting shift value on line 26 for use in an FMAC operation.

The shift value is used to line up the mantissas for the add portion of the FMAC operation. The floating point numbers used by the FMAC operation are each expressed as a mantissa and an exponent. The result of the multiply operation (A*B) produces a product that typically has a different exponent than the exponent of operand C. The FMAC operation uses the shift value to shift, and hence "line up," the mantissa of operand C for adding it with the mantissa of the A*B product. Although the mantissa of operand C is shifted, the mantissa of the A*B product could alternatively be shifted to perform the add operation. Calculating the shift value and performing the shifting of the mantissa of operand C occur during the multiply operation. The format of floating point numbers and addition of them are known in the art.

Using these multiple stages within circuit 10 to produce the shift value can introduce a significant amount of delay in performing the FMAC operation. Accordingly, a need exists for a faster method of implementing an FMAC operation.

SUMMARY

An embodiment consistent with the present invention reduces propagation delays within a circuit for performing an FMAC operation. An apparatus consistent with the present invention includes a plurality of latches for containing a plurality of operands. A CSA circuit performs a CSA operation on the operands to produce a first result, and a logic block performs a CLA operation on the first result to produce a second result. A logic circuit in the logic block performs a logic operation on the second result based upon a control signal to produce a shift value for use in the FMAC operation.

A method consistent with the present invention includes receiving a plurality of operands. A CSA operation is performed on the operands to produce a first result, and a CLA operation is performed on the first result to produce a second result. A logic operation is performed on the second result, as part of the CLA operation, based upon a control signal to produce a shift value for use in the FMAC operation.

DESCRIPTION OF THE DRAWINGS

The accompanying drawings are incorporated in and constitute a part of this specification and, together with the description, explain the advantages and principles of the invention. In the drawings.

DETAILED DESCRIPTION

Circuitry consistent with the present invention reduces propagation delays in performing an FMAC operation by eliminating one stage of logic used in generating a shift value for the operation. Another stage of logic is modified to perform a parallel logic operation and account for the reduced logic stage. This results in increased speed of execution in calculating the shift value for use in an FMAC operation.

Figure 1:
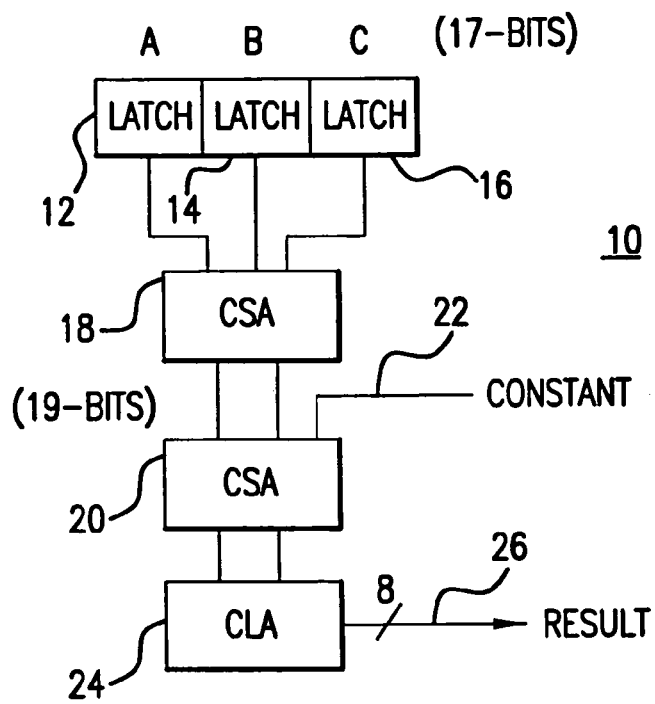
FIG. 1 is a logic diagram of a prior art circuit for use in implementing an FMAC operation, including a carry-lookahead adder (CLA) 24.
Figure 2:
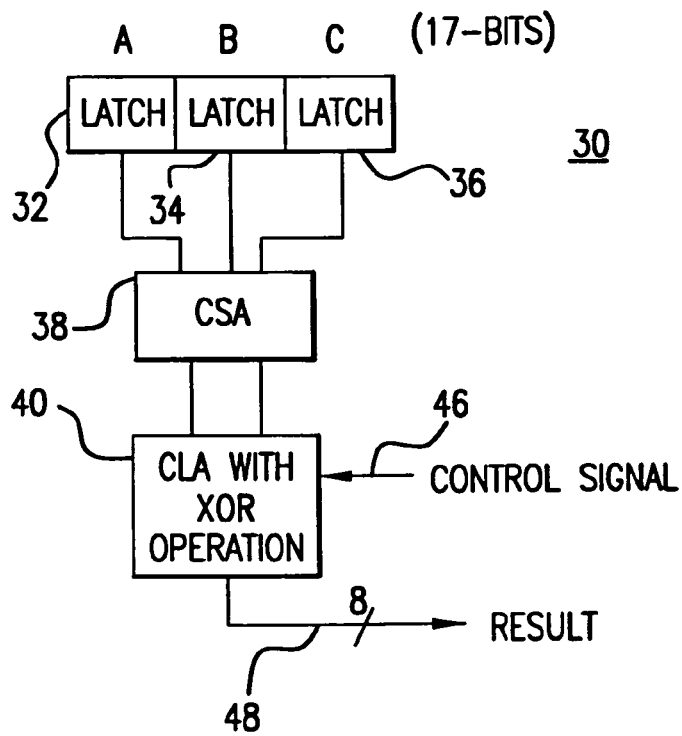
FIG. 2 is a logic diagram of a circuit for use in implementing an FMAC operation consistent with the present invention, including a CLA 40.

FIG. 2 is a logic diagram of a circuit 30 for use in performing an FMAC operation consistent with the present invention. Circuit 30 illustrates modification of prior art circuit 10 shown in FIG. 1. Circuit 30 includes three latches 32, 34, and 36 for containing three operands A, B and C for the FMAC operation, shown as 17-bit operands in this example. A CSA 38 receives the values of operands A, B, and C from latches 32, 34, and 36. In circuit 30, however, a second CSA corresponding with CSA 20 in circuit 10 is eliminated. Elimination of the second CSA increases speed of calculation of the resulting shift value for use in an FMAC operation by eliminating one stage of logic; it thus reduces the corresponding propagation delays.

A logic block 40 receives the outputs from CSA 38 and provides a resulting shift value on line 48. The shift value is used, as explained above, to line up mantissas for the add operation. In this example, logic block 40 is implemented using a CLA that is modified to logically perform an exclusive-OR (XOR) operation on the result of the CLA operation based upon a control signal 46. The XOR function is performed on the most significant bit of the result. Control signal 46 is generated based upon whether the FMAC operation is of SIMD type or non-SIMD type; SIMD operations are known in the art. As explained below, the XOR operation can be implemented within the existing circuitry of a CLA in logic block 40 and thus does not generate any additional propagation delay.

The second CSA 20 can be eliminated based upon how the constant on line 22 operates. In particular, the second CSA 20 in circuit 10 uses only the lower eight bits of the constant on line 22, and those lower eight bits only vary in the most significant bit position. This variance is known because the FMAC operation uses a standard for operating on floating point numbers, as specified in IEEE Standard for Binary Floating-Point Arithmetic, IEEE Std. 754-1985, which is incorporated herein by reference. In addition, CSAs and CLAs, along with the operations they implement, are known in the art.

Figure 3A:
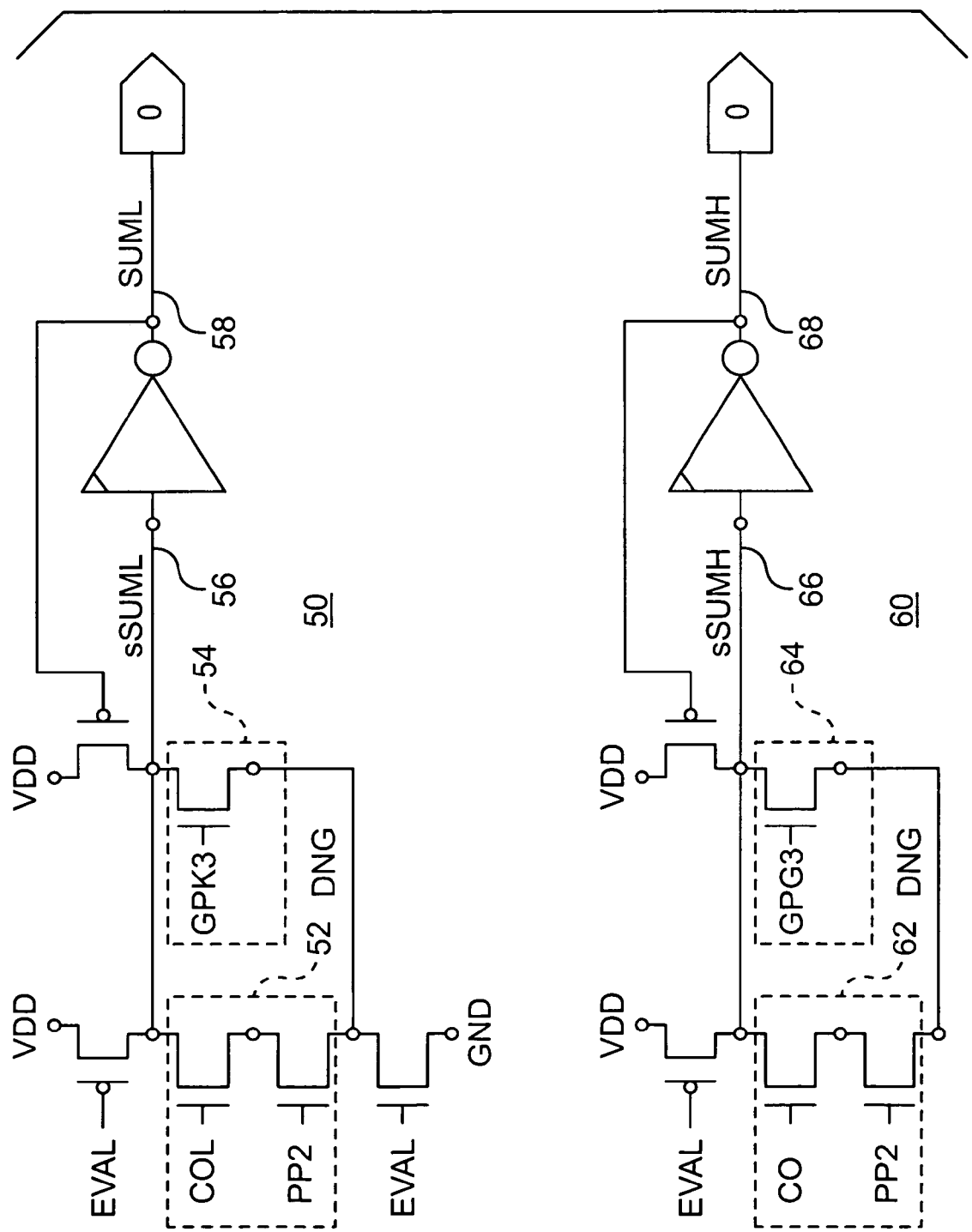
FIG. 3A is a transistor diagram of prior art circuitry for use in implementing an FMAC operation corresponding with the logic diagram in FIG. 1.
Figure 3B:
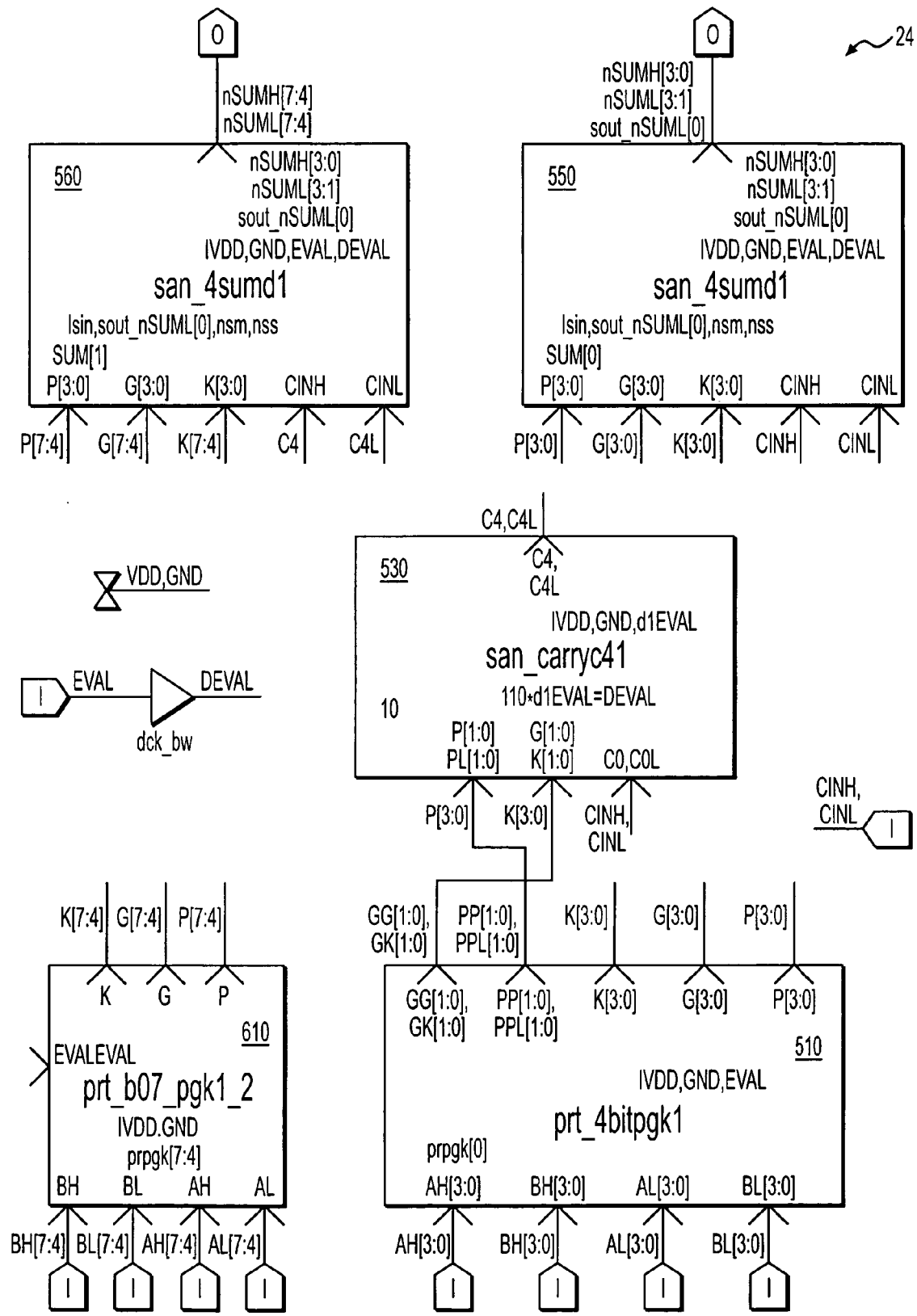
FIG. 3B illustrates the CLA 24 of FIG. 1.
Figure 4:
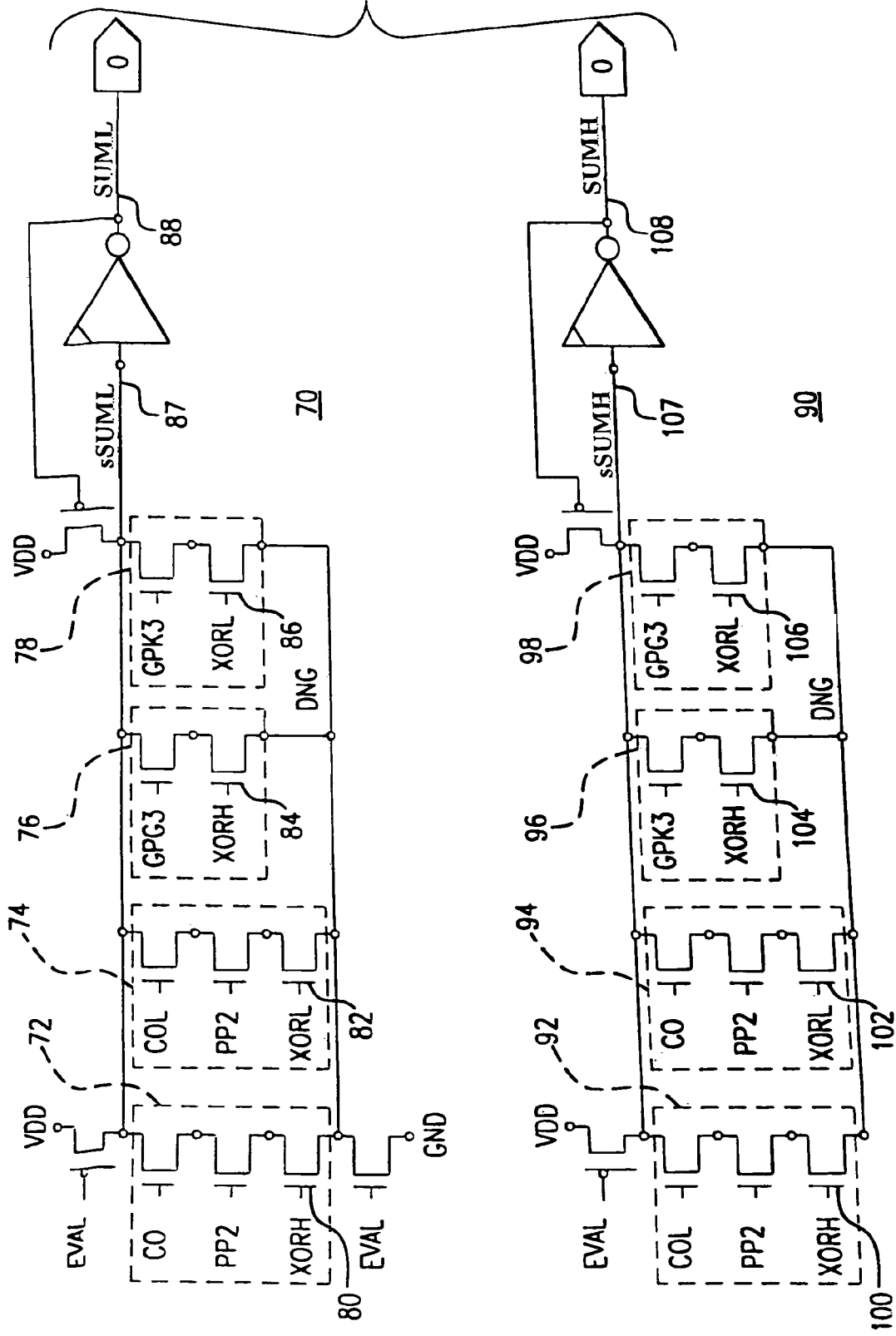
FIG. 4 is a transistor diagram of circuitry for use in implementing an FMAC operation corresponding with the logic diagram in FIG. 2.

FIG. 3A is a transistor diagram of prior art circuitry for implementing a final stage in CLA 24 of prior art circuit 10. In comparison, FIG. 4 is a transistor diagram illustrating an example of how the prior art circuitry in FIG. 3A is modified to implement the XOR operation in circuit 30. Since CLAs are known in the art, only the final stage is shown for illustrative purposes. The first and the second stages of the CLA 24 are illustrated in FIG. 3B. In addition, only the final stage is shown as modified in this example, although additional modifications may be made based on a particular use of the CLA.

As shown in FIG. 3A, a final stage in CLA 24 includes two sets of circuits 50 and 60 corresponding with two bits for each input bit. Two bits exist because this implementation uses, for example, complementary logic referred to as dual rail Domino CMOS or mousetrap logic, which is known in the art. Circuit 50 includes a first stage 52 and second stage 54 producing a summation low (SUML) signal 58 and its complement, a signal sSUML 56. Complementary circuitry 60 includes a first stage 62 and second stage 64 producing summation high (SUMH) signal 68 and its complement, signal sSUMH 66. The signals (EVAL, DNG, C0L, C0, PP2, GPG3, GPK3) shown in circuits 50 and 60 are known in the art with respect to FMAC operations.

Figure 9:
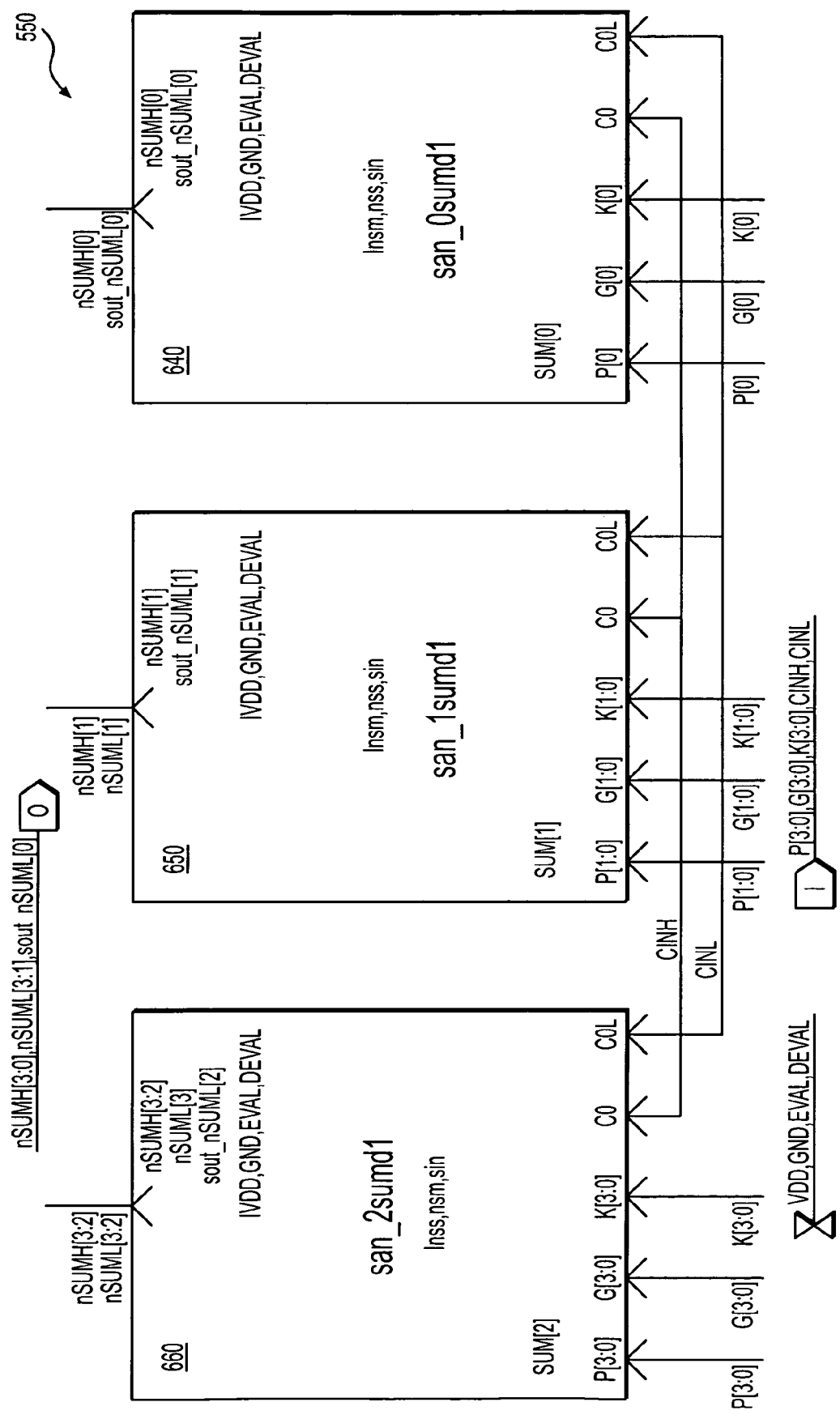

FIG. 3B illustrates the CLA 24 of FIG. 1. Blocks 510 and 610 represent the first stage of the CLA 24. Block 530 represents the second stage of the CLA 24. Blocks 550 and 560 represent the third (or final) stage of the CLA 24. The circuitry in block 560 corresponds to the most significant bit of the final stage of the CLA 24. For example, the circuitry in block 560 computes the four most significant bits of the result. FIG. 9 details the contents of block 560. FIG. 3A shows a portion of the circuitry in block 660 of FIG. 9. Modifications to FIG. 3B in accordance with the present invention are illustrated in FIG. 6B and will be described in detail later.

Blocks 510 and 550 are shown in detail in FIGS. 7 and 9, respectively, and will be described in more detail later. In FIG. 3B, the circuitry in block 560 is the same as the circuitry in block 550. The equations for blocks 530 and 610 are illustrated as follows.

Block 530: $san\_carryc41.eqn$ $$C4 = G[1] + P[1] * (G[0] + P[0] * C0)$$

$$C4L = K[1] + PL[1] * (K[0] + PL[0] * C0L)$$

Block 610: $prt\_b07\_pgk1\_2.eqn$ $$P = AH * BL + AL * BH$$

$$G = AH * BH$$

$$K = AL * BL$$

Specifically, referring to FIG. 1, CSA 18 calculates (A+B+C) and outputs SUM1 and CARRY1. CSA 20 calculates (A+B+C+constant); which may also be expressed as (SUM1+CARRY1+constant). The outputs are SUM[7:0] and CARRY[7:0].

The first stage of the CLA 24 calculates the propagate, generate, and kill signals (PP2, GPG3, and GPK3) based on the signals SUM[7:0] and CARRY[7:0] from CSA 20. The second stage of the CLA 24 calculates the group carry signals (CO/COL) based on the PP2, GPG3, and GPK3 signals from the first stage. The third stage of the CLA 24 calculates RESULT[7:0] using the PP2, GPG3, and GPK3 signals from the first stage as well as the CO/COL signals from the second stage. The result produced in FIG. 1 is the sum of the two operands A and B as well as the constant.

FIG. 4 illustrates circuitry 70 and 90 containing modifications, respectively, to circuits 50 and 60 for implementing the XOR operation in the CLA of logic block 40. The circuitry contained in the CLA 40 will be described in more detail with respect to FIGS. 6-10. Referring to FIG. 4, circuits 70 and 90 illustrate processing on the most significant bit position in the final stage of the CLA in logic block 40. Logic block 40 also includes additional known circuitry for processing of the other bits received from CSA 38 for the CLA operation. Circuit 70, as shown, includes redundant logic for implementing the XOR operation, and it includes two stages 72 and 76 corresponding with the functions of stages 52 and 54. Circuit 70 also includes a redundant stage 74 for stage 72, and a redundant stage 78 for stage 76. Within each of these stages an additional transistor implements the XOR operation. In particular, transistors 80, 82, 84 and 86 implement the XOR operation in, respectively, stages 72, 74, 76 and 78. Therefore, the result of the stages, without use of a second CSA (such as CSA 20), produces a SUML signal 88 and its complement, a signal sSUML 87.

Circuit 90 corresponds with circuit 60 and likewise illustrates modification to implement the XOR operation for the output complementary to stage 70. Circuit 90 includes stages 92 and 96 corresponding with, respectively, stages 62 and 64. Circuit 90 also includes a redundant stage 94 for stage 92, and a redundant stage 98 for stage 96. Each of these stages also includes an additional transistor for implementing the XOR operation. In particular, transistors 100, 102, 104 and 106 implement the XOR operation in, respectively, stages 92, 94, 96, and 98. Therefore, operation of these stages, without use of a second CSA, produces a SUMH signal 108 and its complement, a signal sSUMH 107.

Accordingly, the signals 87, 88, 107, and 108 produce the same resulting shift value on line 48 as the shift value produced on line 26 by signals 56, 58, 66, and 68. Since the XOR operation is performed through modification of a CLA to generate these signals, as shown in circuits 70 and 90, it occurs in parallel with the CLA operation and does not add any significant propagation delay. The various signals (EVAL, C0L, C0, DNG, PP2, GPG3, GPK3) in circuits 70 and 90, aside from the XOR signals, are known in the art.

Figure 5:
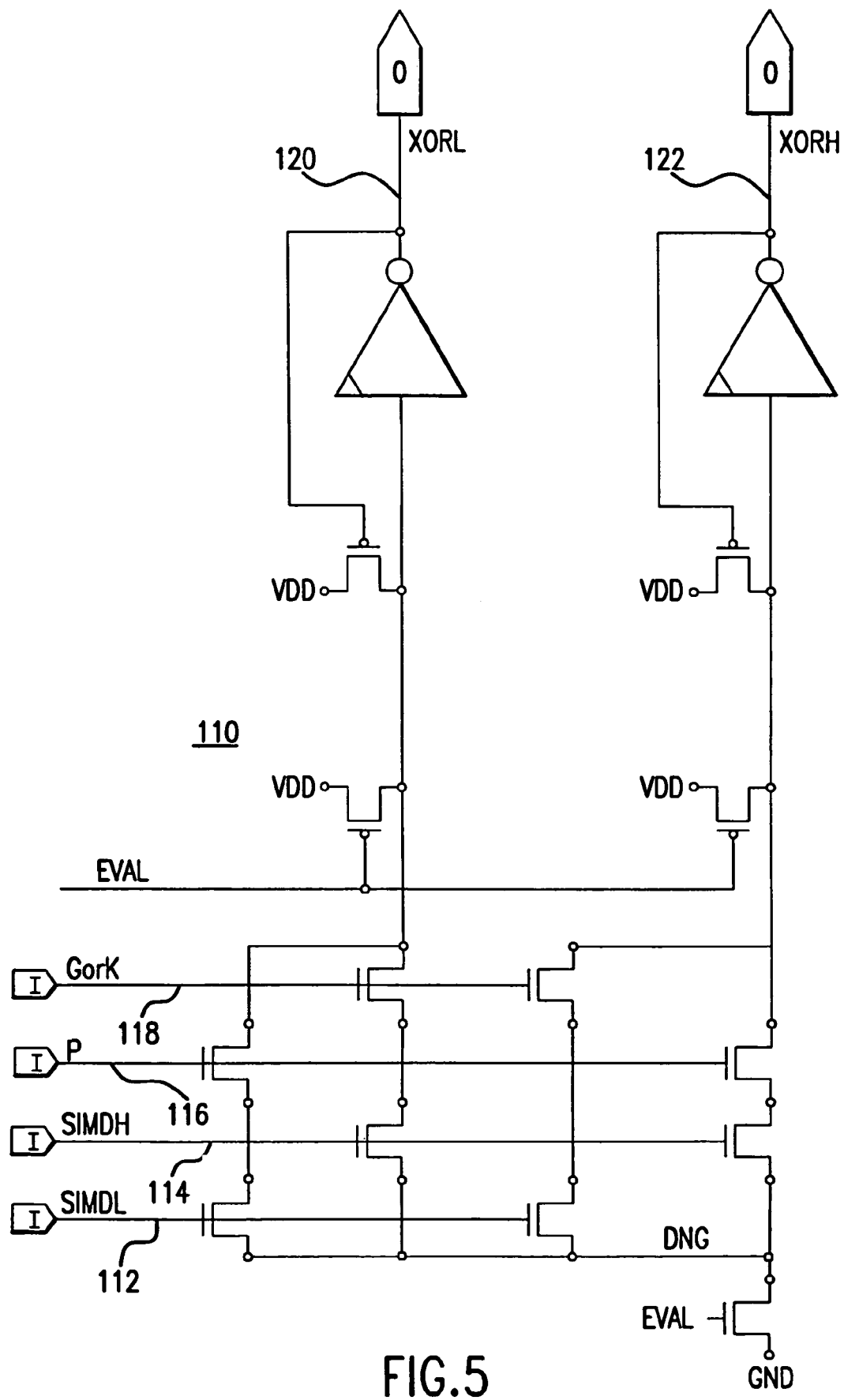
FIG. 5 is a transistor diagram of a control circuit for generating control signals for use in implementing an FMAC operation using the circuitry shown in FIG. 4.

FIG. 5 is a transistor diagram of a control circuit 110 for generating the XOR control signals, XOR high (XORH) and XOR low (XORL), used in circuits 70 and 90. These control signals correspond with control signal 46. The operation of control circuit 110 to generate the XORH and XORL signals occurs in parallel with the CLA operation in logic block 40 or other processing and thus does not affect the overall delay for the CLA operation in logic block 40. In operation, control circuit 110 receives as inputs a SIMD low (SIMDL) signal 112, a SIMD high (SIMDH) signal 114, a P signal 116, and a GorK 118. These input signals are known in the art with respect to FMAC operations. Control circuit 110 logically processes these input signals to generate the XORL signal 120 and its complement, XORH signal 122. In particular, control circuit 110 implements the following logic functions to generate those signals: XORL=(SIMDL)(P)+(SIMDH) (GorK); XORH=(SIMDH)(P)+(SIMDL)(GorK).

Figure 6A:
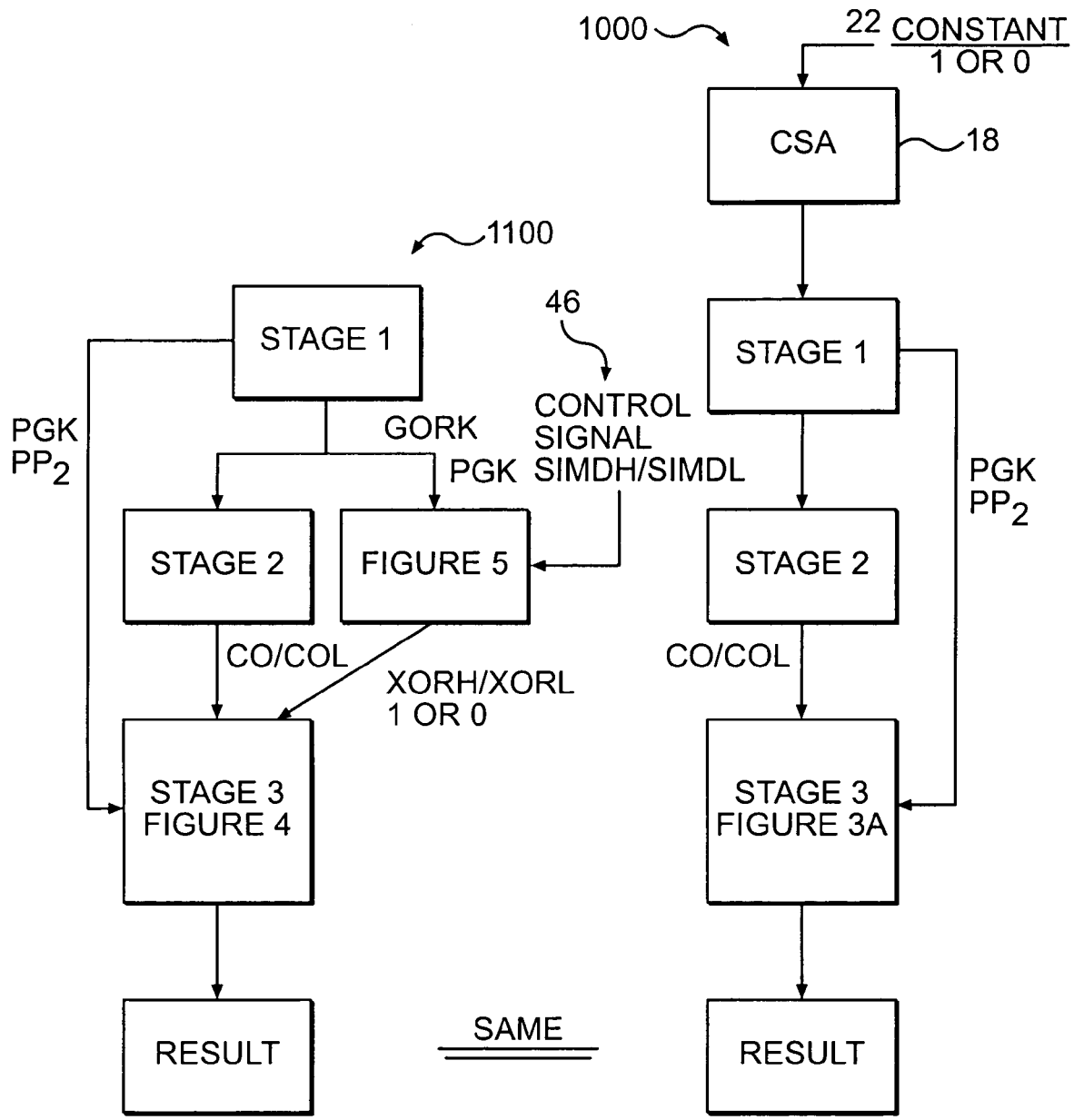
FIG. 6A is an overview of an embodiment of the present invention compared with the prior art.
Figure 6B:
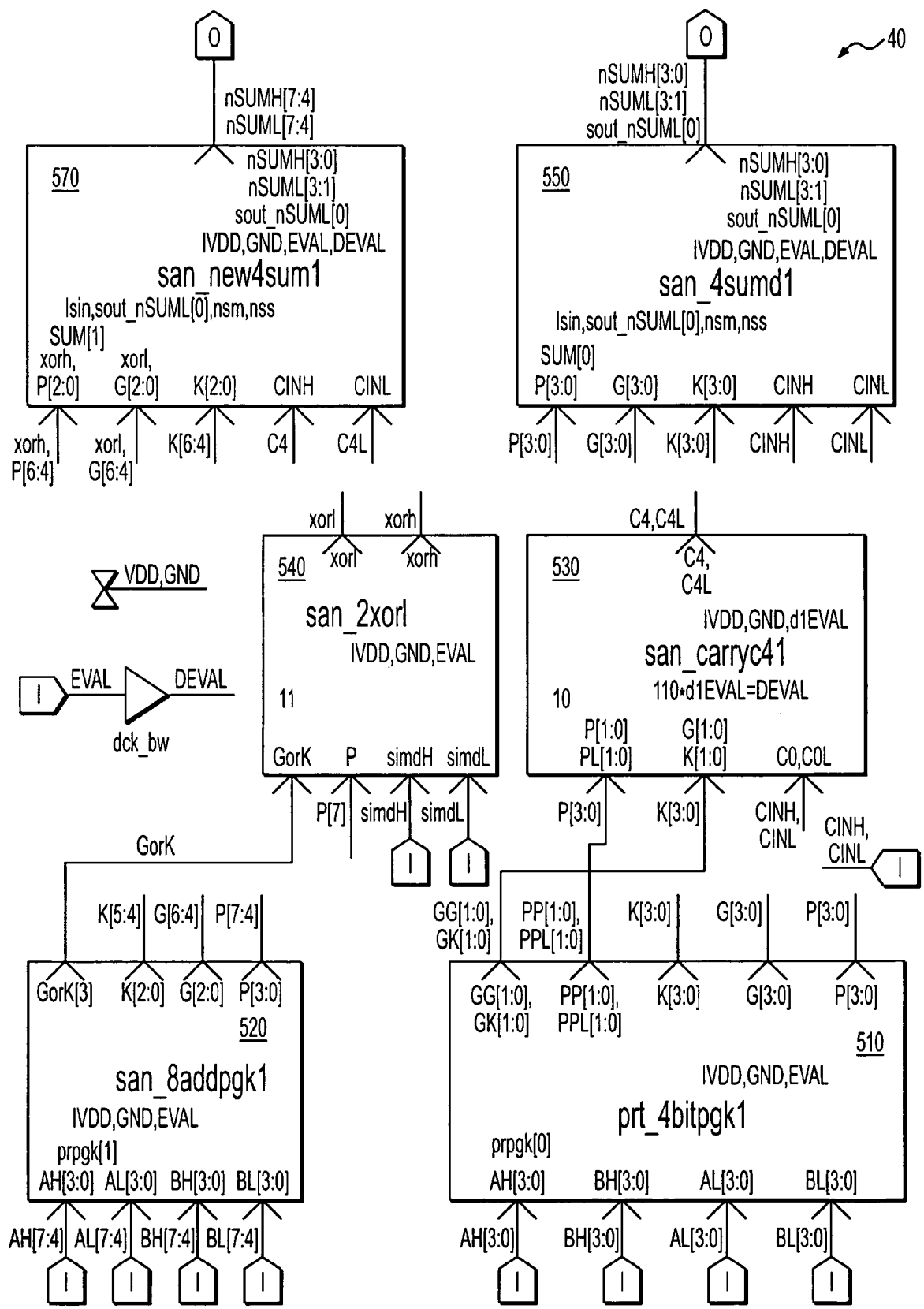
FIG. 6B illustrates the CLA 40 of FIG. 2.

FIG. 6A is an overview of an embodiment of the present invention compared with the prior art. Specifically, FIG. 6A shows how flow or process 1100 and prior art flow or process 1000 achieve the same results. FIG. 6A also shows how flow 1100 eliminates a CSA while achieving the same result as the prior art. In the prior art, there are two possible values for the constant 22 (0 or 1) that need to be added into the final result. The constant 22 only differs in its most significant bit. Rather than use an additional adder, the present invention modifies an existing adder to handle this potential change to the final result's most significant bit. The circuit in FIG. 5 determines whether or not an XOR operation is required. This determination corresponds to selecting one of the two values of the constant.

Referring to flow 1000 in FIG. 6A (which corresponds to FIG. 1), there is a constant input 22 (0 or 1) to CSA 18. Circuitry known in the art (not shown in FIG. 1) determines which of two possible values of the constant becomes constant input 22. Once this is determined, the addition operation proceeds using the selected value.

Referring to flow 1100 in FIG. 6A. (which corresponds to FIG. 2), the control signal 46 determines whether or not to perform an XOR operation. Performing an XOR operation corresponds to selecting a first value of the constant; whereas not performing an XOR operation corresponds to selecting a second value of the constant. Once this selection is made, the addition operation proceeds, and the addition operation generates a result that is identical to what would have been produced by the circuitry shown in FIG. 1 (flow 1000).

Specifically, referring to FIG. 2, CSA 38 calculates (A+B+C) and outputs SUM[7:0] and CARRY[7:0]. The first stage of the CLA 40 calculates the propagate, generate, and kill signals (PP2, GPG3, and GPK3 as well as variants of these signals called P and GorK) based on the signals SUM[7:0] and CARRY[7:0] from CSA 38. The second stage of the CLA 40 calculates the group carry signals (CO/COL) based on the PP2, GPG3, and GPK3 signals from the first stage. In parallel, the circuitry in FIG. 5 calculates the signals XORH/XORL using the P and GorK signals from first stage of the CLA 40 as well as the SIMDH/SIMDL control signal pair (represented as control signal 46 in FIG. 2).

The third stage of the CLA 40 calculates RESULT[7:0] using the PP2, GPG3, and GPK3 signals from the first stage, the CO/COL signals from the second stage, and the signal pair XORH/XORL from the circuit in FIG. 5.

The result produced in FIG. 2 is therefore the sum of the two operands A and B as well as the constant which is generated using the modified third stage of the CLA 40.

Accordingly, with the use of these control signals an entire CSA has been eliminated within the exemplary implementation for use in implementing an FMAC operation. The resulting propagation delay has likewise been eliminated. This modification thus results in increased speed of calculation for the FMAC operation and corresponding improvement in performance for other circuitry that uses this implementation for the FMAC operation. Although dual rail Domino CMOS has been shown to implement the modified CLA operation, any type of suitable logic may be used. In addition, if a particular application does not require or use complementary outputs, then only one modified final stage in the CLA can be used.

Figure 10:
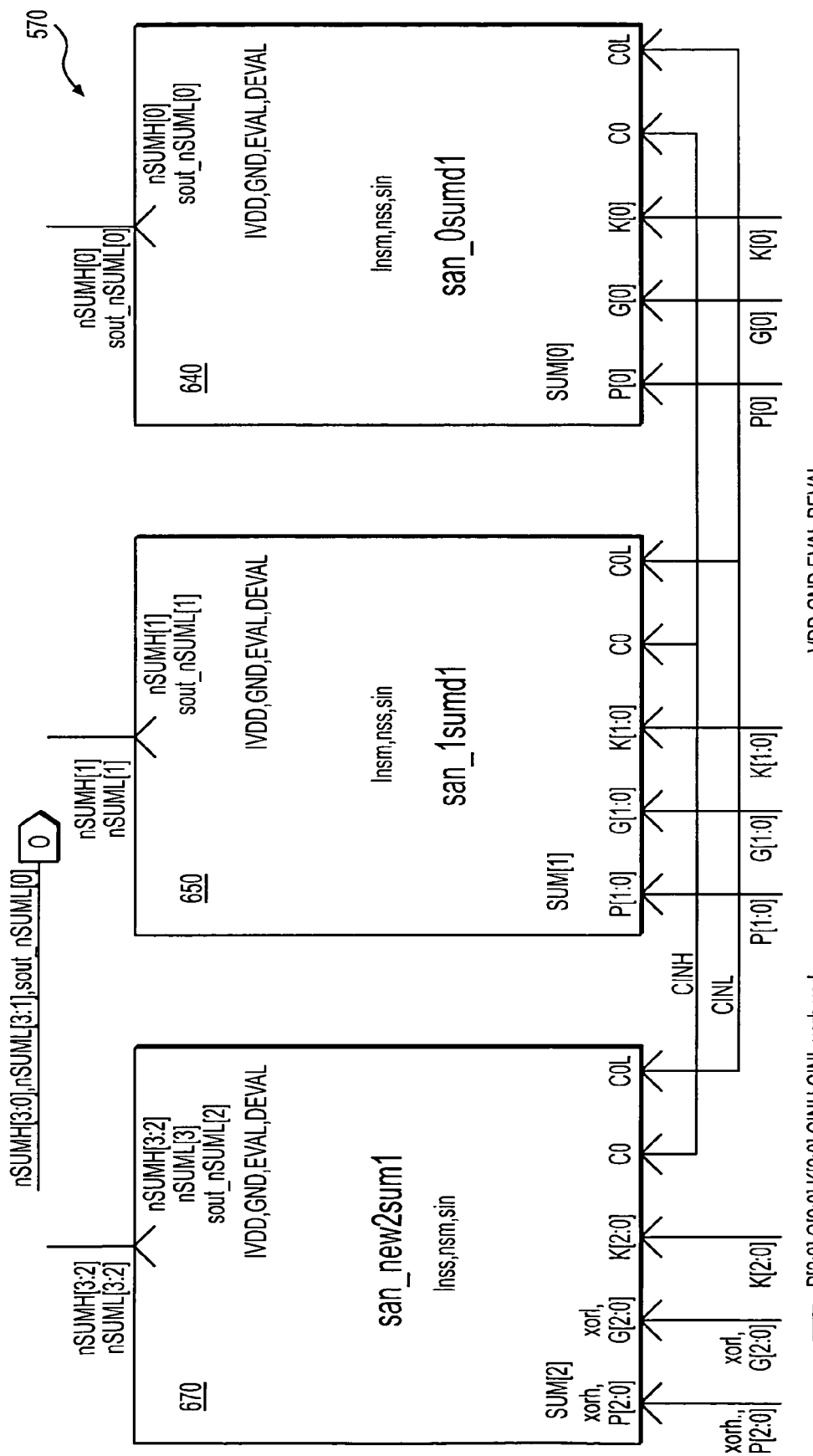

FIG. 6B illustrates the CLA 40 of FIG. 2. FIGS. 7 and 9 show blocks that are common to both CLA 24 and CLA 40. FIGS. 8 and 10 show blocks that are unique to CLA 40. FIG. 6B illustrates modifications to the circuitry in FIG. 3B. Similar to FIG. 3B, blocks 510 and 520 represent the first stage of the CLA 40. Blocks 530 and 540 represent the second stage of the CLA 40. Blocks 550 and 570 represent the third (or final) stage of the CLA 40. The circuitry in block 570 corresponds to the most significant bit of the final stage of the CLA 40. For example, the circuitry in block 570 computes the four most significant bits of the result. FIG. 10 details the contents of block 570. FIG. 4 shows a portion of the circuitry in block 670 of FIG. 10.

Referring to FIG. 6B, blocks 510, 530, and 550 are the same as blocks 510, 530, and 550, respectively, of FIG. 3B. Modifications to FIG. 3B are shown in blocks 520, 540, and 570.

The third stage of the CLA 40 operates on all bits of the operands. The special circuitry described in FIG. 4 only affects the most significant bit. For example, the third stage of the CLA 40 produces a 8-bit result. The lower bits [6:0] are produced normally; i.e. these bits are simply the usual sum generated from an addition operation. Only the circuitry that processes the most significant bit [7] differs from the prior art circuitry.

Compare with block 610 of FIG. 3B, the CLA 40 in FIG. 6B replaces the instances 'prpgk[7:4]' with a single instance "prpgk[1]" of type san__8addpgk1 (shown in block 520 and described with respect to FIG. 8). The CLA 40 of FIG. 6B also includes an additional block san__2xor1 (block 540). Finally, the CLA 40 of FIG. 6B modifies the most significant bit of the final stage in the block san_new4sum1 (block 570).

The circuitry in blocks 510, 520, 550, and 570 are shown in detail in FIGS. 7, 8, 9, and 10, respectively. The equations for blocks 530 and 540 are illustrated as follows. FIG. 5 shows the circuitry in the block san__2xor1 (block 540).

Block 530: san_carryc41.eqn $$C4=G[1]+P[1]*(G[0]+P[0]*C0)$$

$$C4L=K[1]+PL[1]*(K[0]+PL[0]*C0L)$$

Block 540: san__2xor1.eqn $$xorh=P*simdH+GorK*simdL$$

$$xorl=P*simdL+GorK*simdH$$

Figure 7:
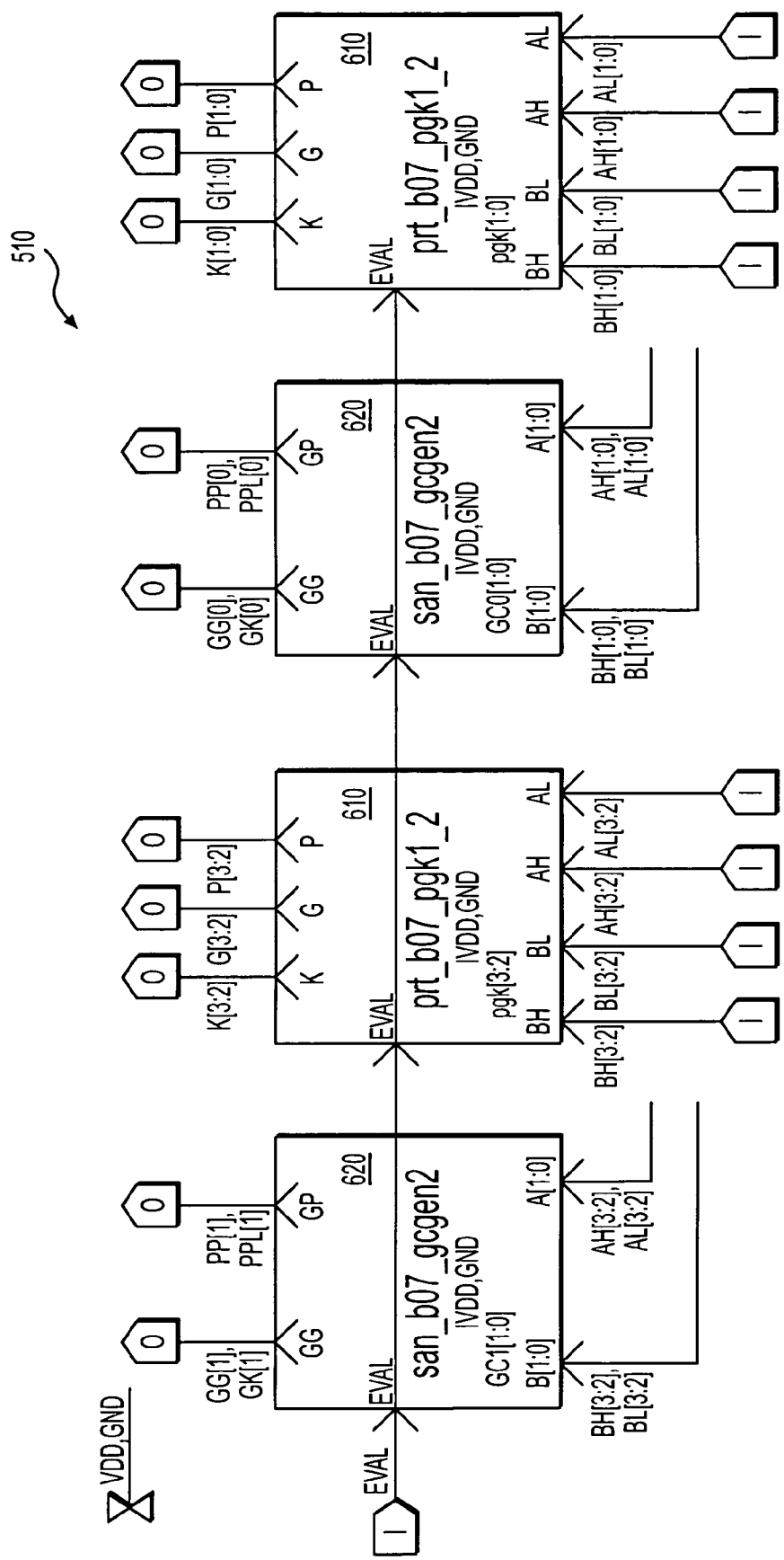
FIGS. 7 and 9 show blocks that are common to both CLA 24 and CLA 40.
Figure 8:
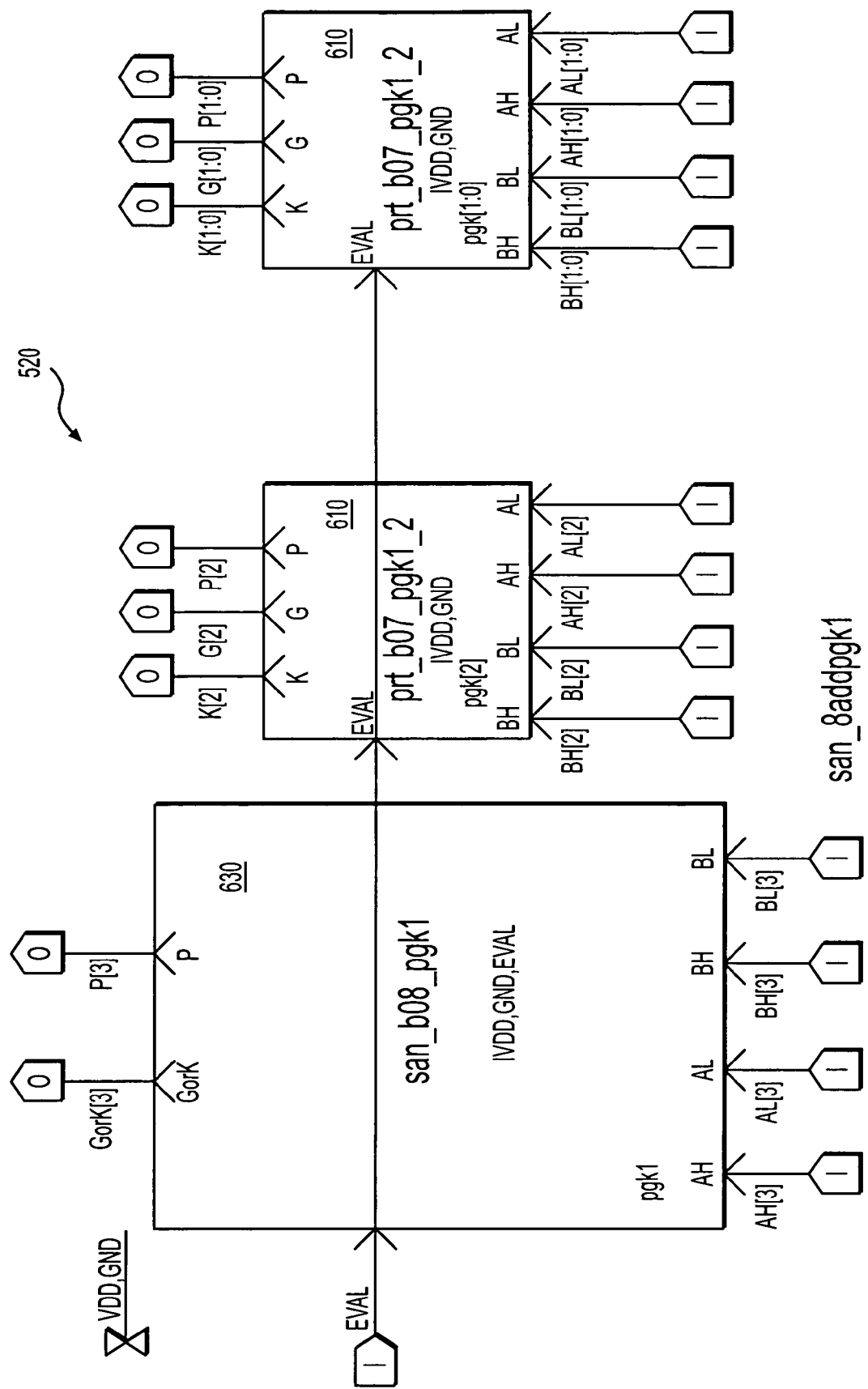
FIGS. 8 and 10 show blocks that are unique to CLA 40.

FIG. 7 illustrates block 510 prt__4 bitpgk1 of FIGS. 3 and 6. The equations corresponding to blocks 610 and 620 are shown as follows.

Block 610: prt_b07_pgk1__2.eqn $$P=AH*BL+AL*BH$$

$G=AH*BH$ $K=AL*BL$

Block 620: san_b07_gcgen2.eqn $GG=A[1]*B[1]+(A[1]+B[1])*A[0]*B[0]$ $GP=(A[1]+B[1])*(A[0]+B[0])$ FIG. 8 illustrates block 520 san_8addpgk1 of FIG. 6. The equations corresponding to blocks 610, 620, and 630 are shown as follows.

Block 610: prt_b07_pgk1__2.eqn $P=AH*BL+AL*BH$ $G=AH*BH$ $K=AL*BL$

Block 620: san_b07_gcgen2.eqn $GG=A[1]*B[1]+(A[1]+B[1])*A[0]*B[0]$ $GP=(A[0]+B[1])*(A[0]+B[0])$ Block 630: san_b08_pgk1.eqn $P=AH*BL+AL*BH$ $GorK=AH*BH+AL*BL$ FIG. 9 illustrates block 550 san__4sumd1 of FIGS. 3 and 6. The equations corresponding to blocks 640, 650, and 660 are shown as follows.

Block 640: san__0sumd1.eqn $!nSUMH[0]=C0L*P[0]+C0*(G[0]+K[0])$ $!sout\_nSUML[0]=C0*P[0]+C0L*(G[0]+K[0])$ Block 650: san__1sumd1.eqn $grpGCH=P[0]*(G[1]+K[1])$ $grpPCL=P[1]*P[0]$ $grpPGK=P[1]*K[0]+G[0]*(G[1]+K[1])$ $grpPGKL=P[1]*G[0]+K[0]*(G[1]+K[1])$ $!nSUMH[1]=C0*grpGCH+C0L*grpPCL+grpPGK$ $!sout\_nSUML[1]=C0L*grpGCH+C0*grpPCL+grpPGKL$ Block 660: san__2sumd1.eqn $GorK=G[2]+K[2]$ $GorK3=G[3]+K[3]$ $grpPG=G[1]+P[1]*G[0]$ $grpPGL=P[2]*(G[1]+P[1]*G[0])$ $gPG3=G[2]+P[2]*(G[1]+P[1]*G[0])$ $grpPKL=K[1]+P[1]*K[0]$ $grpPK=P[2]*(K[1]+P[1]*K[0])$ $gPK3=K[2]+P[2]*(K[1]+P[1]*K[0])$ $PP1=P[1]*P[0]$ $PP2=P[2]*P[1]*P[0]$ $PP3=P[3]*P[2]*P[1]*P[0]$ $dP3=P[3]$ $GK2=PP1*GorK$ $GK3=PP2*GorK3$ $!nSUMH[2]=C0*GK2+C0L*PP2+grpPK+grpPG*GorK$ $!sout\_nSUML[2]=C0L*GK2+C0*PP2+grpPKL*GorK+grpPGL$ $!nSUMH[3]=C0*GK3+C0L*PP3+gPK3*dP3+gPG3*GorK3$ $!nSUML[3]=C0L*GK3+C0*PP3+gPK3*GorK3+gPG3*dP3$ FIG. 10 illustrates block 570 san_new4sumd1 of FIG. 6. The equations corresponding to blocks 640, 650, and 670 are shown as follows. FIG. 4 shows part of the circuitry in the block san_new2sum1 (block 670). As noted above, the circuitry in FIG. 4 corresponds to the most significant bit.

Block 640: san__0sumd1.eqn $!nSUMH[0]=C0L*P[0]+C0*(G[0]+K[0])$ $!sout\_nSUML[0]=C0*P[0]+C0L*(G[0]+K[0])$ Block 650: san__1sumd1.eqn $grpGCH=P[0]*(G[1]+K[1])$ $grpPCL=P[1]*P[0]$ $grpPGK=P[1]*K[0]+G[0]*(G[1]+K[1])$ $grpPGKL=P[1]*G[0]+K[0]*(G[1]+K[1])$ $!nSUMH[1]=C0*grpGCH+C0L*grpPCL+grpPGK$ $!sout\_nSUML[0]=C0L*grpGCH+C0*grpPCL+grpPGKL$ Block 670: san_new2sum1.eqn $GorK=G[2]+K[2]$ $grpPG=G[1]+P[1]*G[0]$ $grpPGL=P[2]*(G[1]+P[1]*G[0])$ $gPG3=G[2]+P[2]*(G[1]+P[1]*G[0])$ $grpPKL=K[1]+P[1]*K[0]$ $grpPK=P[2]*(K[1]+P[1]*K[0])$ $gPK3=K[2]+P[2]*(K[1]+P[1]*K[0])$ $PP1=P[1]*P[0]$ $PP2=P[2]*P[1]*P[0]$ $GK2=PP1*GorK$ $!nSUMH[2]=C0*GK2+C0L*PP2+grpPK+grpPG*GorK$ $!sout\_nSUML[2]=C0L*GK2+C0*PP2+grpPKL*GorK+grpPGL$ $!nSUMH[3]=(C0*PP2+gPG3)*xorh+(C0L*PP2+gPK3)*xorl$ $!nSUML[3]=(C0L*PP2+gPK3)*xorh+(C0*PP2+gPG3)*xorl$ While the present invention has been described in connection with an exemplary embodiment, it will be understood that many modifications will be readily apparent to those skilled in the art, and this application is intended to cover any adaptations or variations thereof. For example, different types of CSAs and CLAs, different types of transistors to implement the XOR and other logic functions, different size operands, and various types of logic for generating the control signals may be used without departing from the scope of the invention. This invention should be limited only by the claims and equivalents thereof.

What is claimed is:

1. An apparatus for reducing propagation delays in a circuit for use in performing a floating point multiply-accumulate operation, comprising:
 a plurality of latches that contain a plurality of operands for the operation;
 a carry-save adder, coupled to the latches, that receives the operands and performs a carry-save add operation on the operands to produce a first result;
 a control circuit for generating a control signal; and
 a logic block, coupled to the carry-save adder, that receives the first result and performs a carry-lookahead add operation on the first result to produce a second result using transistors, the logic block having a logic circuit that uses a redundant logic stage including an additional transistor to perform an excusive-OR operation between a most significant bit of the second result and the control signal in parallel with the carry-lookahead add operation to produce a value for use in the floating point multiply-accumulate operation.

2. The apparatus of claim 1 wherein the control circuit performs the logic operation to produce a shift value for use in the floating point multiply-accumulate operation.

3. The apparatus of claim 1 wherein the control circuit generates the control signal based upon a single instruction, multiple data (SIMD) operation.

4. The apparatus of claim 1 wherein the control signal is a pair of complementary signals and wherein the control circuit generates the pair of complementary signals.

5. The apparatus of claim 1 wherein the logic block includes a carry-lookahead adder having complementary logic circuits for providing complementary outputs as the second result.

* * * * *

UNITED STATES PATENT AND TRADEMARK OFFICE
CERTIFICATE OF CORRECTION

PATENT NO. : 7,444,366 B2
APPLICATION NO. : 10/853518
DATED : October 28, 2008
INVENTOR(S) : Paul R. Thayer et al.

Page 1 of 1

It is certified that error appears in the above-identified patent and that said Letters Patent is hereby corrected as shown below:

In column 8, lines 36-37, delete "!sout_nSUML[0]" and insert -- !sout_nSUML[1] --, therefor.

In column 10, line 4, in Claim 1, delete "excusive-OR" and insert -- exclusive-OR --, therefor.

Signed and Sealed this

Sixth Day of October, 2009

David J. Kappos
*Director of the United States Patent and Trademark Office*